(12) United States Patent
Payne

(10) Patent No.: US 6,338,158 B1
(45) Date of Patent: *Jan. 8, 2002

(54) CUSTOM IC HARDWARE MODELING USING STANDARD ICS FOR USE IN IC DESIGN VALIDATION

(75) Inventor: Robert L. Payne, San Jose, CA (US)

(73) Assignee: VLSI Technology, Inc., San Jose, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/962,597

(22) Filed: Oct. 31, 1997

(51) Int. Cl.[7] ............................................. G06F 17/50
(52) U.S. Cl. ................................ 716/4; 716/5; 703/14; 703/23
(58) Field of Search ..................... 395/500.34, 500.35, 395/500.36, 500.43, 500.46; 703/13, 14, 15, 22, 25, 27, 28; 716/4, 5

(56) References Cited

U.S. PATENT DOCUMENTS

| | | | | |
|---|---|---|---|---|
| 5,572,710 A | * | 11/1996 | Asano et al. | 395/500.36 |
| 5,678,028 A | * | 10/1997 | Bershteyn et al. | 395/500.43 |
| 5,721,695 A | * | 2/1998 | McMinn et al. | 364/578 |
| 5,768,497 A | * | 6/1998 | Uemura et al. | 714/28 |
| 5,798,645 A | * | 8/1998 | Zeiner et al. | 714/33 |
| 6,058,492 A | * | 5/2000 | Sample et al. | 714/33 |

* cited by examiner

Primary Examiner—Tom Thomas
Assistant Examiner—Vuthe Sier
(74) Attorney, Agent, or Firm—Burns Doane Swecker & Mathis LLP

(57) ABSTRACT

Testing and validation of custom IC designs is performed using standard ICs. Highly complex integrated circuits, instead of being designed at the gates and flops level, are typically designed using standardized cell libraries that allow for widespread, systematic design reuse. Such libraries may include Functional System Blocks, or FSBs (sometimes referred to as ASIC cores), and Application Specific Standard Parts (ASSPs). ASSPs are designs that are or were once realized as stand-alone parts, but that may also be embedded into larger designs ("embedded ASSPs"). Instead of a conventional software model, testing and validation is performed using a hardware model of a custom integrated circuit. The hardware model may be a breadboard system that is decomposed into three levels of functionality: ASSPs, FSBs and "glue logic"ASSPs are typically 500K gates or more and may be realized as separate ICs. FSBs are typically 50K gates or less. A collection of commonly used FSBs are therefore provided on a single integrated circuit (FSBIC) in such a way that by applying a predetermined control signal to the FSBIC, it will behave as a selected one of the FSBs. The hardware model may use as many FSBICs as required to map to the FSBs in the custom IC design. Logic on the custom IC that is not part of an ASSP or an FSB may be regarded as glue logic. A hardware emulator (e.g., a programmable logic IC) may be used to model the glue logic.

6 Claims, 2 Drawing Sheets

CUSTOM IC HARDWARE MODELING USING STANDARD ICS FOR USE IN IC DESIGN VALIDATION

BACKGROUND OF THE INVENTION

1. Field of the Invention

The present invention relates to validation of integrated circuit designs.

2. State of the Art

As integrated circuit designs become increasingly complex, design validation and testing become increasingly important and increasingly difficult. Pre-silicon design validation may be distinguished from post-silicon testing. Design validation is both necessary and highly advantageous. Without some level of design validation, first-generation silicon parts may often be bug-ridden to an extent that renders post-silicon testing very difficult. Furthermore, "design turns"—the cycle of redesign and fabrication—are costly and time consuming. Ideally, design validation would be sufficiently advanced as to eliminate further design turns.

Design validation has been largely based on software simulation. Software simulations, however, run in excess of six orders of magnitude slower than the real hardware being simulated. Current submicron process technology is capable of cost effectively implementing several million gates on a single die. To perform thorough validation of a design of 1M or more gates would typically require running the hardware in a validation laboratory for several months. To attempt to duplicate two months of hardware validation with software simulation would take hundreds of millennia—clearly too long for the typical product cycle! Furthermore, software models are always abstractions of the real hardware such that there remains ambiguity as to the software model's actual performance/function. Hence, as technology moves into the deep submicron region with its attendant complexity level, the conventional software simulation approach to integrated circuit design and validation is becoming obsolete.

SUMMARY OF THE INVENTION

The present invention, generally speaking, provides for validation of custom IC designs using standard ICs. Highly complex integrated circuits, instead of being designed at the gates and flops level, are typically designed using standardized cell libraries that allow for widespread, systematic design reuse. Such libraries may include Functional System Blocks, or FSBs (sometimes referred to as ASIC cores), and Application Specific Standard Parts (ASSPs). ASSPs are designs that are or were once realized as stand-alone parts, but that may also be embedded into larger designs ("embedded ASSPs"). Instead of using a conventional software model, validation is performed using a hardware model of a custom integrated circuit. The hardware model may be a breadboard system that may be decomposed into three levels of functionality: ASSPs, FSBs and "glue logic" In an exemplary embodiment, ASSPs are typically 500K gates or more and may be realized as separate ICs. FSBs are typically 50K gates or less. A collection of commonly used FSBs are therefore provided on a single integrated circuit (FSBIC) in such a way that by applying a predetermined control signal to the FSBIC, it will behave as a selected one of the FSBs. In an exemplary embodiment, the hardware model uses as many FSBICs as required to map to the FSBs in the custom IC design. Logic on the custom IC that is not part of an ASSP or an FSB may be regarded as glue logic. In an exemplary embodiment, a hardware emulator (e.g., a programmable logic IC) is used to model the glue logic. The resulting hardware model runs within one or two orders of magnitude of the speed of the custom IC design, allowing considerably more validation to be performed. The difference in speed between the hardware model and the specified design speed results largely from interconnect delays. In addition to running one nearly at design speed, the hardware model removes the doubt and ambiguity encountered in software simulation, since the least ambiguous specification for a function is a physical implementation of that function.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
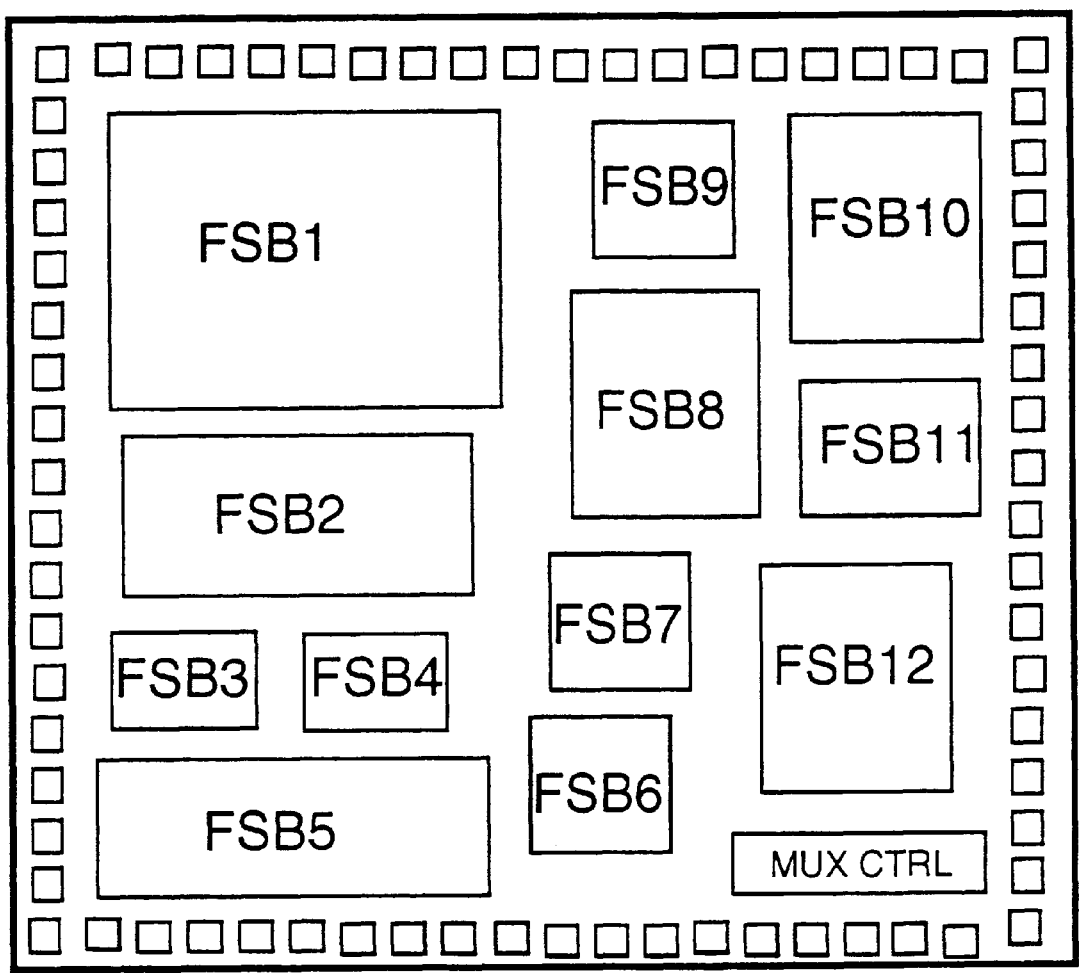
FIG. 1 is a block diagram of an FSBIC in accordance with one embodiment of the present invention.

Referring now to FIG. 1, a block diagram of an FSBIC in accordance with one embodiment of the present invention is shown. A collection, or library, of FSBs are integrated onto a single test chip. In FIG. 1, the number of FSBs on the FSBIC is twelve, however, the number of FSBs may be lesser or greater. A mux isolation I/O scheme is used whereby different ones of the FSBs are connected to a I/O pins depending on a control signal applied to a muxed control block. Mux isolation of this type is known. The result is a multiple-FSB, hardware model breadboard part. The single part may be readily documented, inventoried and distributed to customers to be used as part of a customer's hardware model.

Figure 2:
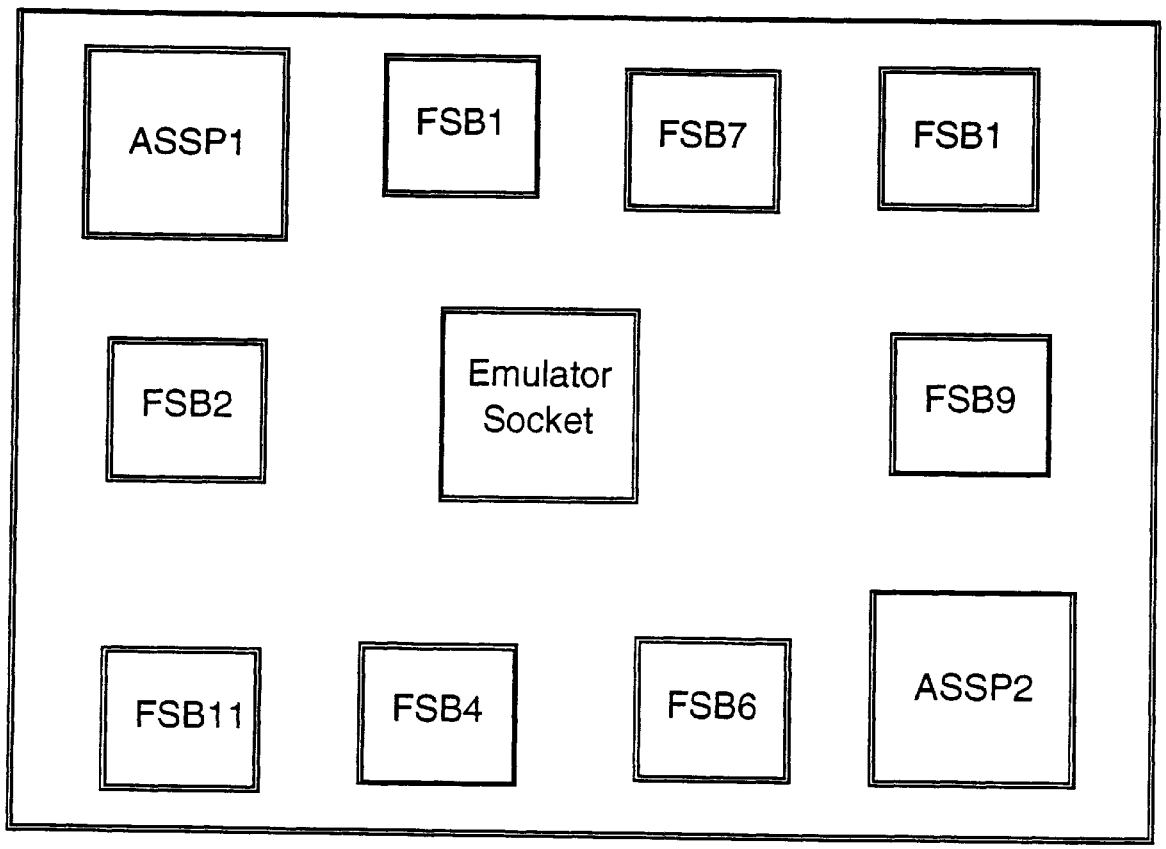
FIG. 2 is a block diagram of a hardware model using FSBICs of the type shown in FIG. 1.

A block diagram of an exemplary hardware model is shown in FIG. 2. The hardware model may be a breadboard system that is decomposed into three levels of functionality: ASSPs, FSBs and glue logic. In an exemplary embodiment, ASSPs are typically 500K gates or more and may be realized as separate ICs. FSBs are typically 50K gates or less. A collection of commonly used FSBs are therefore provided on a single integrated circuit (FSBIC) in such a way that by applying a predetermined control signal to the FSBIC, it will behave as a selected one of the FSBs. In an exemplary embodiment, the hardware model uses as many FSBICs as required to map to the FSBs in the custom IC design. Logic on the custom IC that is not part of an ASSP or an FSB may be regarded as glue logic. In an exemplary embodiment, a hardware emulator (e.g., a programmable logic IC) is used to model the glue logic.

Typically, the mux control inputs of each of the FSBICs will be jumpered to cause the FSBIC to function as a particular FSB. An emulator socket is provided to receive the glue logic hardware emulator.

The breadboard hardware model of FIG. 2, because it is built from actual hardware blocks, is guaranteed to have the same functional performance as the custom IC design. Because of interconnect delays, the breadboard hardware model cannot be expected to function at full speed of the custom IC design. However, the breadboard hardware model may be expected to run within one to two orders of magnitude of design speed, an improvement of four or five orders of magnitude over software simulation.

The FSBIC of FIG. 1 may also be used in a hardware modeler environment. In a hardware modeler environment, a software simulator queries a hardware modeler, which exercises a hardware model and passes results back to the software simulator. In this instance, a single FSBIC may be used to model various different FSBs. All that is required is that the hardware modeler set the correct mux isolation control signals to address the requested FSB to be simulated via the hardware modeling strategy.

It will be apparent to those of ordinary skill in the art that the present invention may be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A hardware model of an integrated circuit for use in design validation of an integrated circuit wherein said integrated circuit includes a plurality of electrically interconnected and functionally interdependent standardized cell libraries, said libraries selectively including functional system blocks and application specific standard parts, said model comprising:

a plurality of silicon building blocks, each of said silicon building blocks having selectively functional system blocks and application specific standard parts identical to a respective one of said standardized cell libraries such that the model exhibits the same functional performance as said integrated circuit, wherein said plurality of building blocks are each electrically isolated from one another and function independently of one another;

a multiplexer circuit coupled to said plurality of silicon building blocks and to I/O pins of said integrated circuit; and a control circuit coupled to other I/O pins of said integrated circuit for controlling said multiplexer, whereby different ones of the silicon building blocks are exercised in concert with one another to perform design validation.

2. The apparatus of claim 1 wherein said control circuit controls said multiplexer circuit so as to couple exactly one of said silicon building blocks to said I/O pins.

3. A circuit assembly including a plurality of hardware models for use in design validation of an integrated circuit wherein said integrated circuit includes a plurality of electrically interconnected and functionally interdependent standardized cell libraries, said libraries selectively including functional system blocks and application specific standard parts, each of said models comprising:

a plurality of silicon building blocks, wherein each of said silicon building blocks having selectively functional system blocks and application specific standard parts identical to a respective one of said standardized cell libraries such that the model exhibits the same functional performance as said integrated circuit, wherein said plurality of silicon building blocks are each electrically isolated from one another and function independently of one another;

a multiplexer circuit coupled to said plurality of silicon building blocks and to I/O pins of said integrated circuit; and a control circuit coupled to other I/O pins of said integrated circuit for controlling said multiplexer, whereby different ones of the silicon building blocks are exercised in concert with one another to perform design validation;

wherein said control circuit controls said multiplexer so as to couple exactly one of said silicon building blocks to said I/O pins.

4. The apparatus of claim 3 comprising at least one further model different than said models.

5. The apparatus of claim 4 wherein said further integrated circuit is an application specific standard part.

6. The apparatus of claim 5 further comprising glue logic and interconnections connecting said integrated circuits, said at least one further model, and said glue logic.

* * * * *